(12) United States Patent
Dupuis

(10) Patent No.: US 8,854,777 B2
(45) Date of Patent: Oct. 7, 2014

(54) SYSTEMS AND METHODS FOR ESD PROTECTION FOR RF COUPLERS IN SEMICONDUCTOR PACKAGES

(75) Inventor: Timothy J. Dupuis, West Lake Hills, TX (US)

(73) Assignee: Avago Technologies General IP (Singapore) Pte. Ltd. (SG)

( * ) Notice: Subject to any disclaimer, the term of this patent is extended or adjusted under 35 U.S.C. 154(b) by 468 days.

(21) Appl. No.: 12/940,488

(22) Filed: Nov. 5, 2010

(65) Prior Publication Data
US 2012/0113553 A1  May 10, 2012

(51) Int. Cl.
| H02H 9/00 | (2006.01) |
| H02H 3/22 | (2006.01) |
| H02H 3/20 | (2006.01) |
| H02H 9/04 | (2006.01) |

(52) U.S. Cl.
USPC .............................. 361/56; 361/111; 361/91.1

(58) Field of Classification Search
USPC ......................................... 361/56, 111, 91.1
See application file for complete search history.

(56) References Cited

U.S. PATENT DOCUMENTS

| 6,529,059 B1 | 3/2003 | Davis ............................. 327/310 |
| 6,940,104 B2 * | 9/2005 | Yeh et al. ....................... 257/104 |
| 7,280,330 B2 | 10/2007 | Oguzman et al. ............... 361/56 |
| 7,391,596 B2 * | 6/2008 | Khorram .......................... 361/58 |
| 7,518,841 B2 | 4/2009 | Chuang et al. ................... 361/56 |
| 7,525,779 B2 * | 4/2009 | Chen et al. ...................... 361/56 |
| 7,583,212 B2 * | 9/2009 | Khorram ........................ 341/126 |
| 7,787,227 B1 | 8/2010 | Terrovits ......................... 361/56 |
| 7,859,803 B2 | 12/2010 | Ma et al. ......................... 361/56 |
| 2006/0268479 A1 | 11/2006 | Bischof ............................ 361/56 |
| 2009/0273397 A1 | 11/2009 | Bockelman et al. ............. 330/51 |
| 2009/0278609 A1 | 11/2009 | Srinivasan et al. ............. 330/297 |
| 2010/0149703 A1 | 6/2010 | Yeh et al. ......................... 361/56 |
| 2011/0304012 A1 * | 12/2011 | Kim et al. ..................... 257/531 |

OTHER PUBLICATIONS

U.S. Appl. No. 12/658,294, "Stacked CMOS Power Amplifier and RF Coupler Devices and Related Methods," filed Feb. 10, 2010.

* cited by examiner

Primary Examiner — Jared Fureman
Assistant Examiner — Lucy Thomas

(57) ABSTRACT

ESD (electrostatic discharge) protection for radio frequency (RF) couplers included in the same semiconductor package as other integrated circuits, such as integrated circuits having power amplifier (PA) circuitry, is disclosed along with related systems and methods. The disclosed embodiments provide ESD protection for RF couplers within semiconductor packages by including coupler ESD circuitry within an integrated circuit within the semiconductor package and coupling the connection ports of the RF coupler to this coupler ESD circuitry. Further, this coupler ESD circuitry can be implemented using two sets of serially connected diodes so that the signal connected to the coupler ESD circuitry can swing around ground without being clipped by the ESD circuitry. Still further, the ESD diodes can be formed in deep N well structures to improve isolation and to reduce parasitic capacitance associated with the ESD diodes.

38 Claims, 6 Drawing Sheets

SYSTEMS AND METHODS FOR ESD PROTECTION FOR RF COUPLERS IN SEMICONDUCTOR PACKAGES

BACKGROUND

In wireless communication devices, radio frequency (RF) power amplifiers (PAs) are often used to provide transmit signals at increased power levels needed for operation within a communication system. For example, cellular telephone devices use PAs to transmit signals at power levels needed to communicate effectively with cellular base stations. In addition, these transmit power levels must often be regulated by the communication device. In prior communication devices, an RF coupler has been used to split off a proportional part of the transmit output signal so that the transmit output power can be monitored by the system.

FIG. 1 (Prior Art) is a block diagram for an embodiment 100 including an RF coupler 102 and power amplifier (PA) integrated circuit 104 for transmission of signals in a wireless communication system. As depicted, the PA integrated circuit 104 receives a transmit signal 114 from external circuitry, for example, from a transceiver or baseband processor integrated circuit. The PA integrated circuit 104 can also receive a transmit power (PWR) control signal 115 from this external circuitry. In operation, the PA integrated circuit 104 provides an amplified transmit signal on signal line 110 to a radio frequency (RF) coupler 102. The RF coupler 102 receives this amplified transmit signal and then outputs an RF transmit (TX) signal on signal line 112 to antenna switch (SW) circuitry 117 through a duplexer 106. The antenna switch (SW) circuitry 117 is coupled to antenna 121. For a transceiver embodiment, the antenna 121 can be used to send and receive RF signals, and the antenna switch circuitry 117 can provide these signals to and from the duplexer 106. In addition to receiving the transmit (TX) signal on signal line 112, the duplexer 106 can also output a receive (RX) signal on signal line 120. And this receive (RX) signal 120, for example, can be provided to other external circuitry, such as a transceiver or baseband processor integrated circuit, if desired.

As indicated above, the RF coupler 102 can be used in the embodiment 100 to provide an RF transmit (TX) power indicator signal to external circuitry, such as a transceiver or baseband processor integrated circuit. The RF coupler 102 has a transmit input connection port 132 and a transmit output connection port 134 that are connected to signal lines 110 and 112, respectively. The incoming amplified transmit signal on signal line 110 passes through input connection port 132 and output connection port 134 and is provided to the duplexer 106 as the transmit (TX) signal on signal line 112. The RF coupler 102 also includes a secondary signal line that is electro-magnetically coupled to the transmit signal line such that the signal on the coupled port 136 provides power proportional to the transmit forward power wave of the RF signal passing through ports 132 and 134, and such that the signal on the isolated port 138 provides power proportional to the reverse transmit power wave of the RF signal passing through ports 132 and 134. The RF forward power indicator signal generated on the output signal line 116 can be used as an RF transmit (TX) power indicator signal. For example, this RF transmit (TX) power indicator signal can be used by external circuitry to determine the transmit power being provided by the PA integrated circuit 104 and then to adjust the transmit (TX) power control signal 115 in order to achieve the desired transmit power to the antenna 121. It is noted that the output ports 136 and 138 for the RF coupler 102 can be terminated to ground using resistors (R), as shown, and these resistors (R) can be 50 ohm termination resistors. It is further noted that the termination of the output ports 136 and 138 can also be implemented through other connections to terminated components, if desired.

In addition to controlling transmit output power, communication devices often also require certain levels of electrostatic discharge (ESD) protection. As such, communication devices typically require certain levels of ESD protection to be provided by the circuitry used within the communication device, such as power amplifiers and RF couplers used in the communication device solution. It is often desirable and required, therefore, for the PA integrated circuit 104 and/or the RF coupler 102 to meet certain ESD requirements within the embodiment 100. For example, integrated circuits are often required to meet a 2 kV human body ESD model for static discharges. It is further noted that ESD events are typically represented by rapid short-tem voltage spikes that need to be discharged to ground.

FIG. 2A provides a circuit diagram for an example of how ESD events are handled by a typical RF coupler 102. As described above, an RF input signal is received at connection port 132 by the RF coupler 102 and is output as an RF output signal at connection port 134. As the RF signal passes through the RF coupler 102, coupling between the primary signal path and the secondary signal line generates the signals for the coupled port 136 and the isolated port 138, as described above. Inductive or magnetic coupling within the RF coupler 102 between the primary and secondary signal paths is represented by the inductor 202 and the inductor 204 within the dashed box 203 in FIG. 2A. Capacitive or electrical coupling within the RF coupler 102 between the primary and secondary signal paths is represented by capacitor 206 and capacitor 208, respectively. For a typical RF coupler 102, these capacitors 206 and 208 will break down when a voltage of about 200-400 volts is placed across them. As such, the ESD protection provided by a typical RF coupler 102 does not meet the 2 kV human body ESD model for static discharges. Thus, to meet this ESD protection at its connection points, the RF coupler 102 would need to be modified or enhanced to provide the necessary ESD protection.

FIG. 2B (Prior Art) provides a block diagram for ESD protection for a typical PA integrated circuit 104. Many integrated circuits will have ESD protection coupled to input/output pins for which ESD protection is desired. As depicted, PA integrated circuit (IC) 104 includes an output connection point 240 for the transmit signal line 110. On the integrated circuit itself, this signal line will be coupled to other internal circuitry, as represented by arrow 252, and would be coupled to PA ESD circuitry 250, if ESD protection were provided for this output connection point or pin. One example of ESD circuitry that is commonly used is a large diode connected between the signal line and ground. These diodes are configured to turn "on" when an ESD event occurs on the signal line so that a signal path is provided from the signal line to ground to discharge the ESD event without destroying the internal circuitry. As such, using this ESD circuitry, integrated circuits such as the PA integrated circuit 104 can meet the 2 kV human body ESD model for static discharges.

For many communication devices, reduction in the space and cost required for the power amplifier device and the RF coupler device is desirable. As such, it is desirable to reduce the size and cost required to implement the RF coupler and the PA integrated circuit while still meeting ESD protection requirements.

DESCRIPTION OF THE DRAWINGS

It is noted that the appended drawings illustrate only exemplary embodiments of the invention and are, therefore, not to be considered limiting of its scope, for the invention may admit to other equally effective embodiments.

DETAILED DESCRIPTION OF THE INVENTION

This present teachings relate generally to radio frequency (RF) power amplifiers and, more particularly, to RF power amplifiers and RF couplers for signal transmission in wireless devices.

ESD (electrostatic discharge) protection for radio frequency (RF) couplers included in the same semiconductor package as an integrated circuit, such as an integrated circuit including power amplifier (PA) circuitry, is disclosed along with related systems and methods. The disclosed embodiments provide ESD protection for RF couplers within semiconductor packages by including coupler ESD circuitry within an integrated circuit within the semiconductor package and coupling the connection ports of the RF coupler to this coupler ESD circuitry. By providing this coupler ESD circuitry, costly ESD enhancements to the RF coupler circuitry are not required. Further, where the coupler ESD circuitry is integrated with PA circuitry, the additional size and cost, if any, associated with adding this coupler ESD circuitry to the integrated circuit is relatively small. Other features and variations can be implemented, if desired, and related systems and methods can be utilized, as well.

Figure 7A:
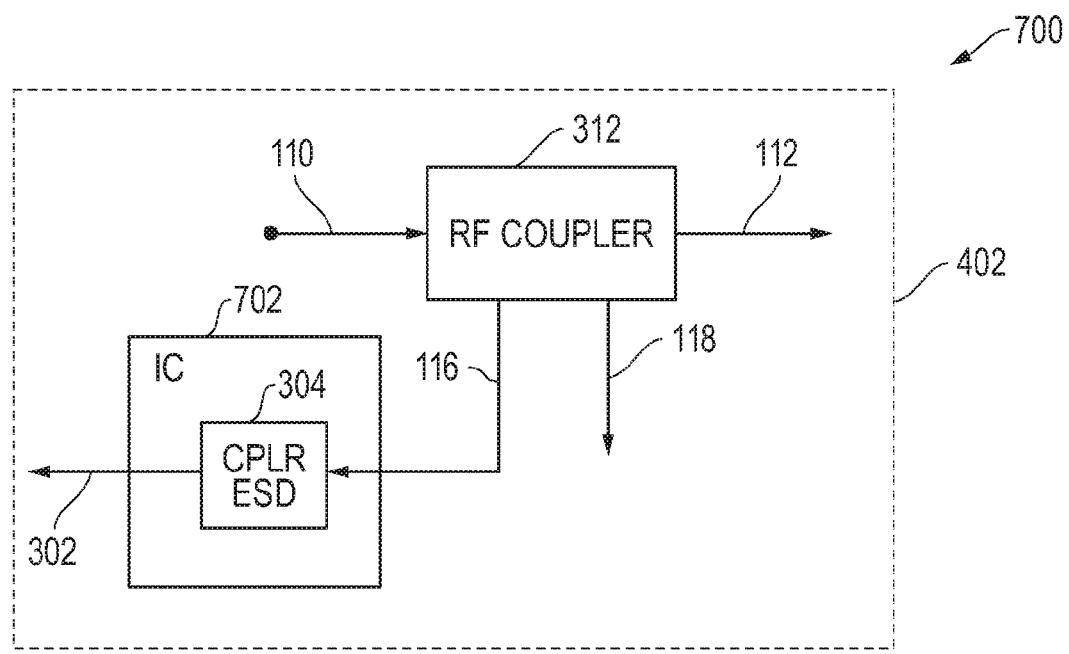
FIGS. 7A-C are block diagrams of embodiments having coupler ESD circuitry coupled to one or more power indicator signal lines associated with an RF coupler.
Figure 7B:
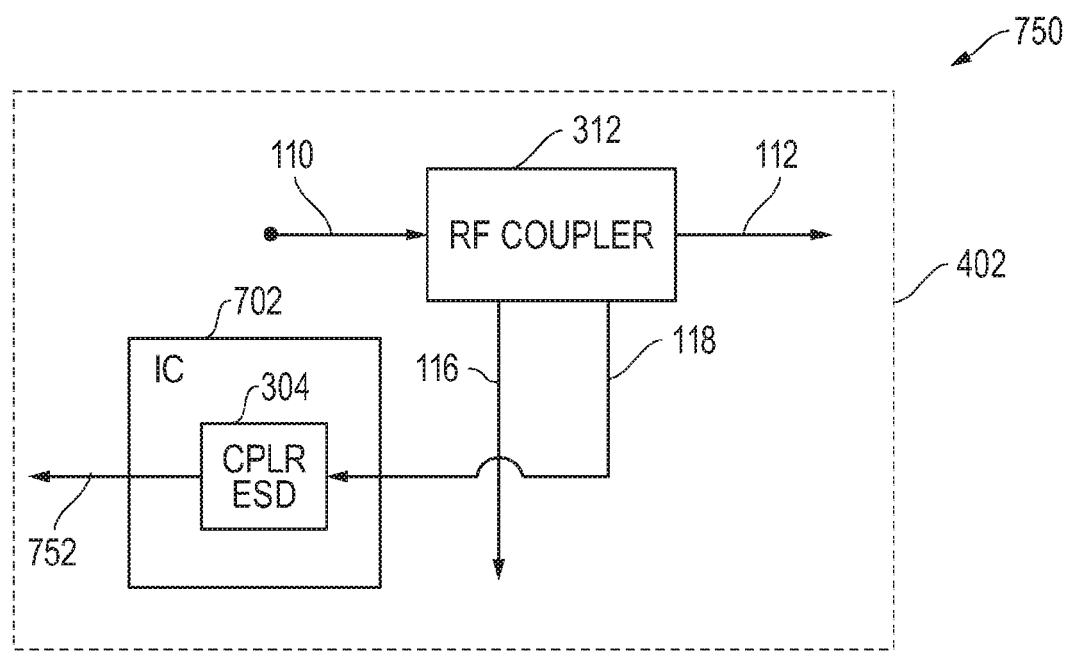
Figure 7C:
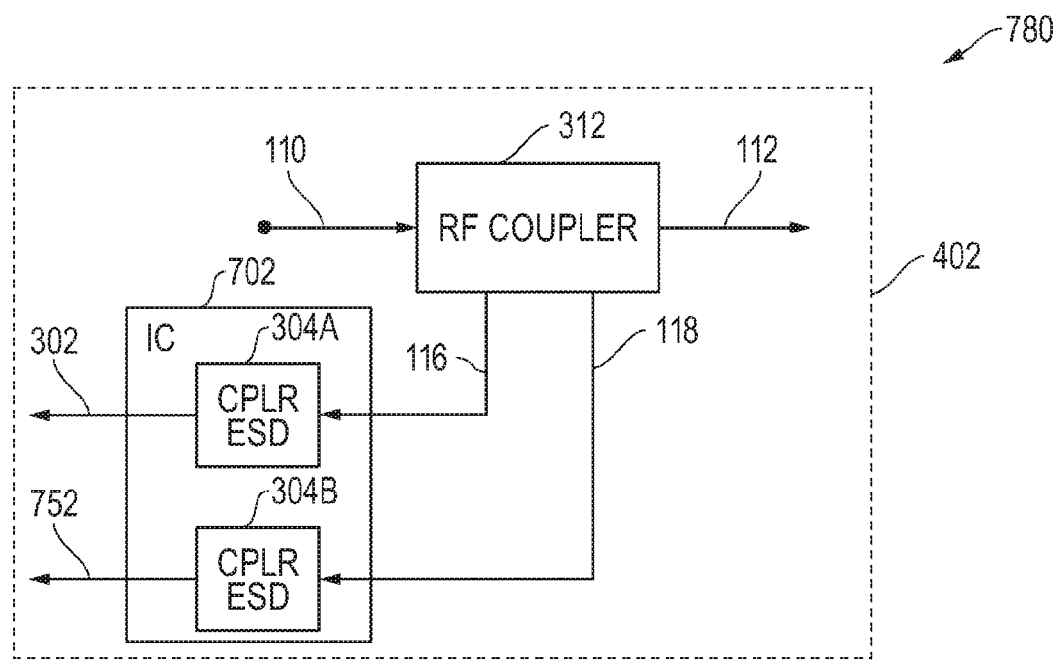
Figure 8:
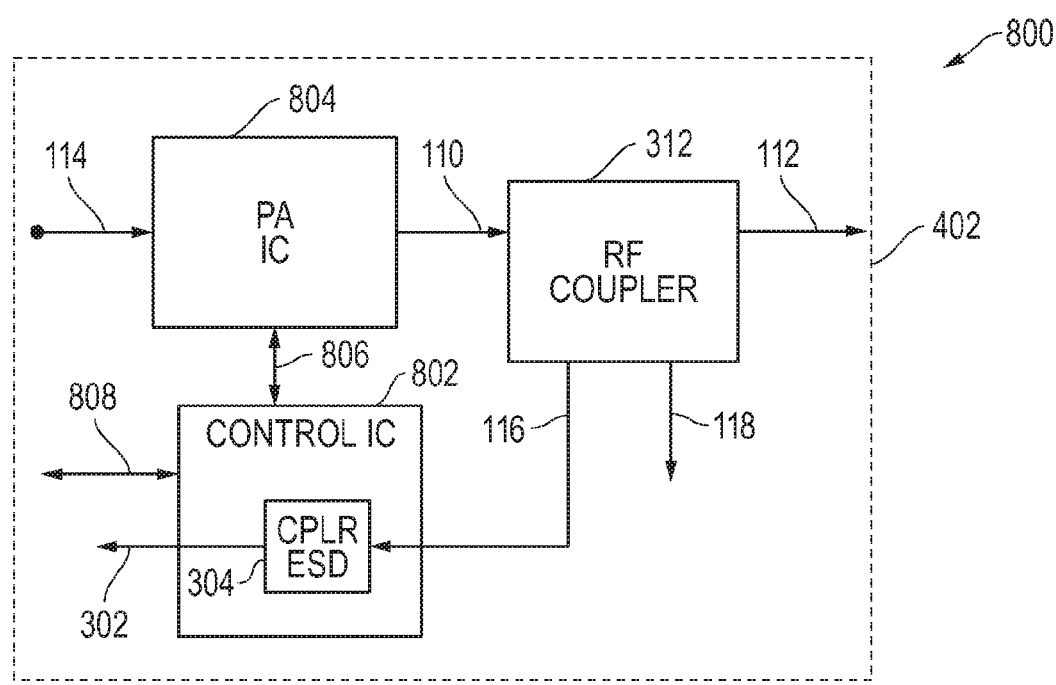
FIG. 8 is a block diagram of an embodiment having coupler ESD circuitry integrated within an integrated circuit separate from a PA integrated circuit within a semiconductor package.

The embodiments will be described in further detail below with respect to the drawings. It is initially noted, however, that while the embodiments of FIGS. 3, 4A-B and 5 include an RF coupler and PA integrated circuits with coupler ESD circuitry within a single semiconductor package, the embodiments of FIGS. 7A-C provide more general embodiments where the ESD circuitry is integrated within an integrated circuit that is within the same semiconductor package as the RF coupler circuitry. This integrated circuit can include PA circuitry, if desired, but could also include circuitry for other purposes, as well. Further, FIG. 8 provides an embodiment where the PA circuitry can be integrated separately from the coupler ESD circuitry, if desired.

Figure 1:
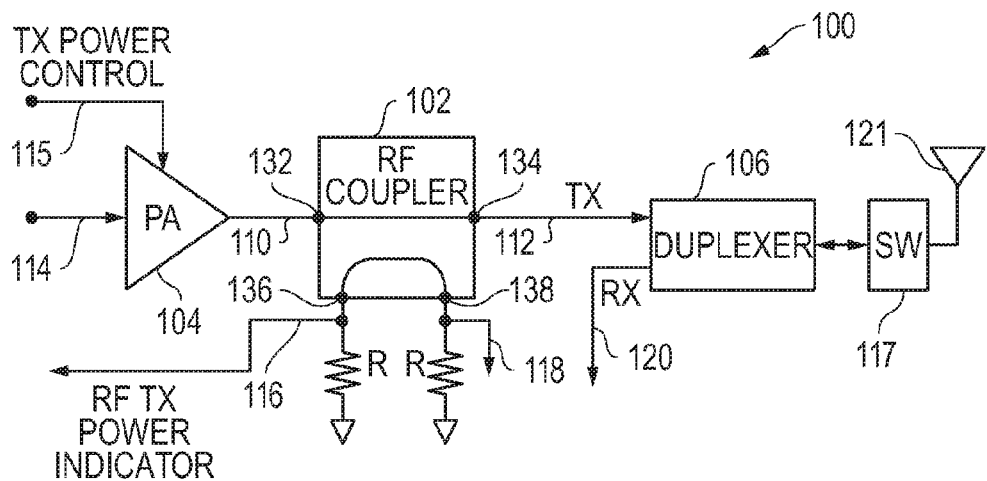
FIG. 1 (Prior Art) is a block diagram of circuitry for a communication device that includes a power amplifier and a radio frequency coupler.
Figure 2A:
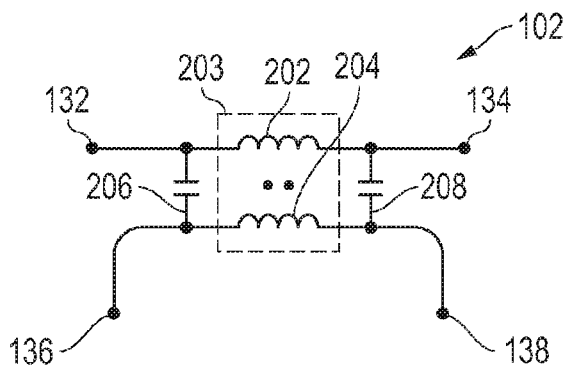
FIG. 2A (Prior Art) is a circuit diagram for a standard RF coupler that can be used as a transmit power indicator.
Figure 2B:
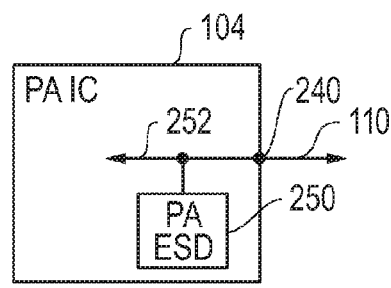
FIG. 2B (Prior Art) is a block diagram for typical electrostatic discharge (ESD) protection that is connected to input pins or connection points for an integrated circuit, such as a power amplifier (PA) integrated circuit (IC).
Figure 3:
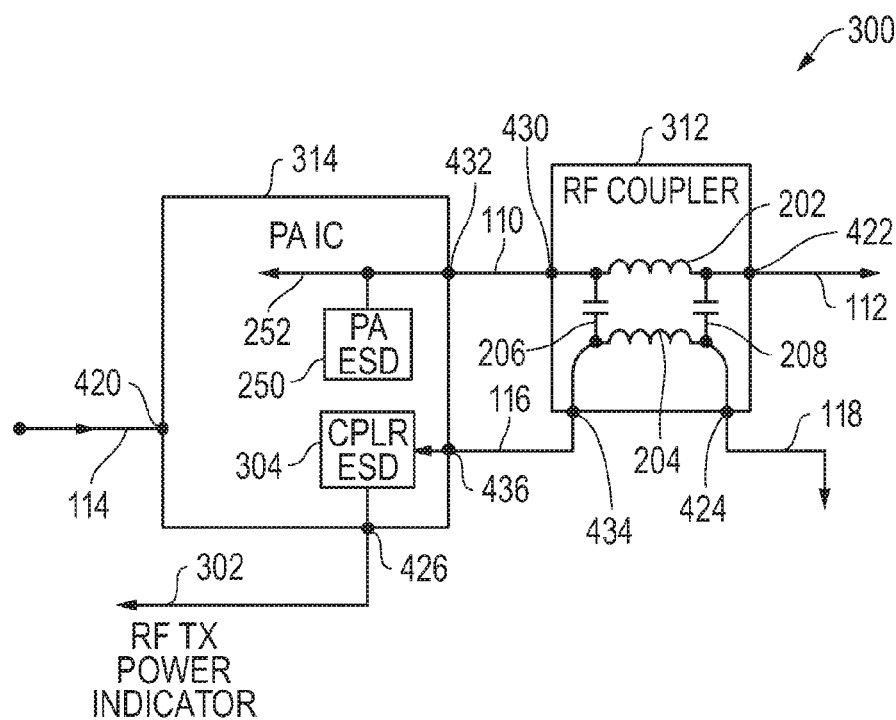
FIG. 3 is a diagram of an example embodiment for an RF coupler and a PA integrated circuit where coupler ESD circuitry is included on the PA integrated circuit.
Figure 4A:
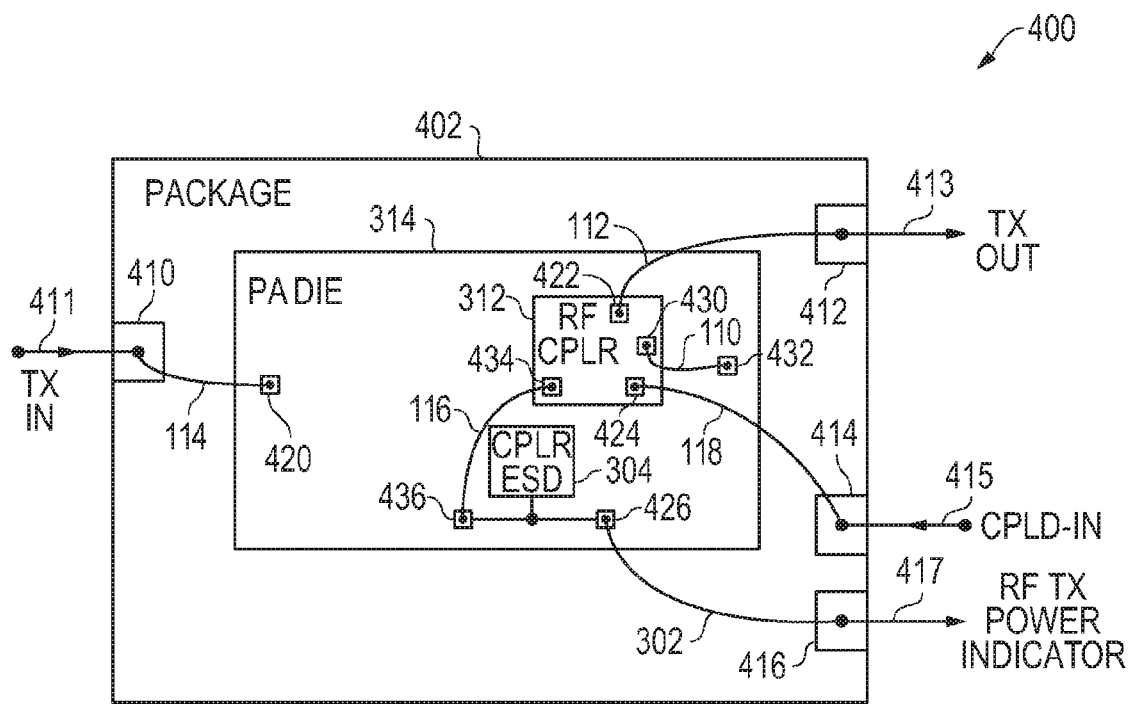
FIG. 4A is a top view connection diagram for a semiconductor package that includes an RF coupler and a PA die having coupler ESD circuitry.
Figure 4B:
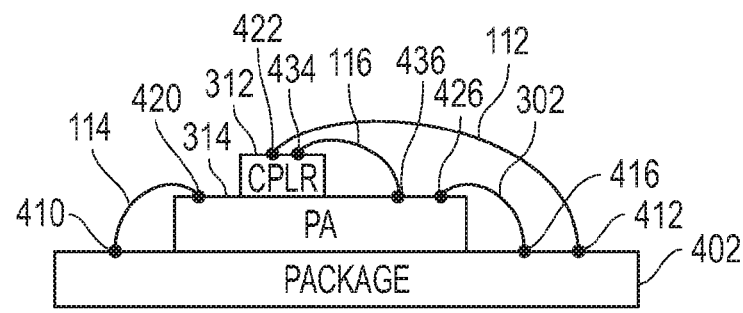
FIG. 4B is a side view connection diagram for a semiconductor package that includes an RF coupler and a PA die having coupler ESD circuitry.
Figure 5:
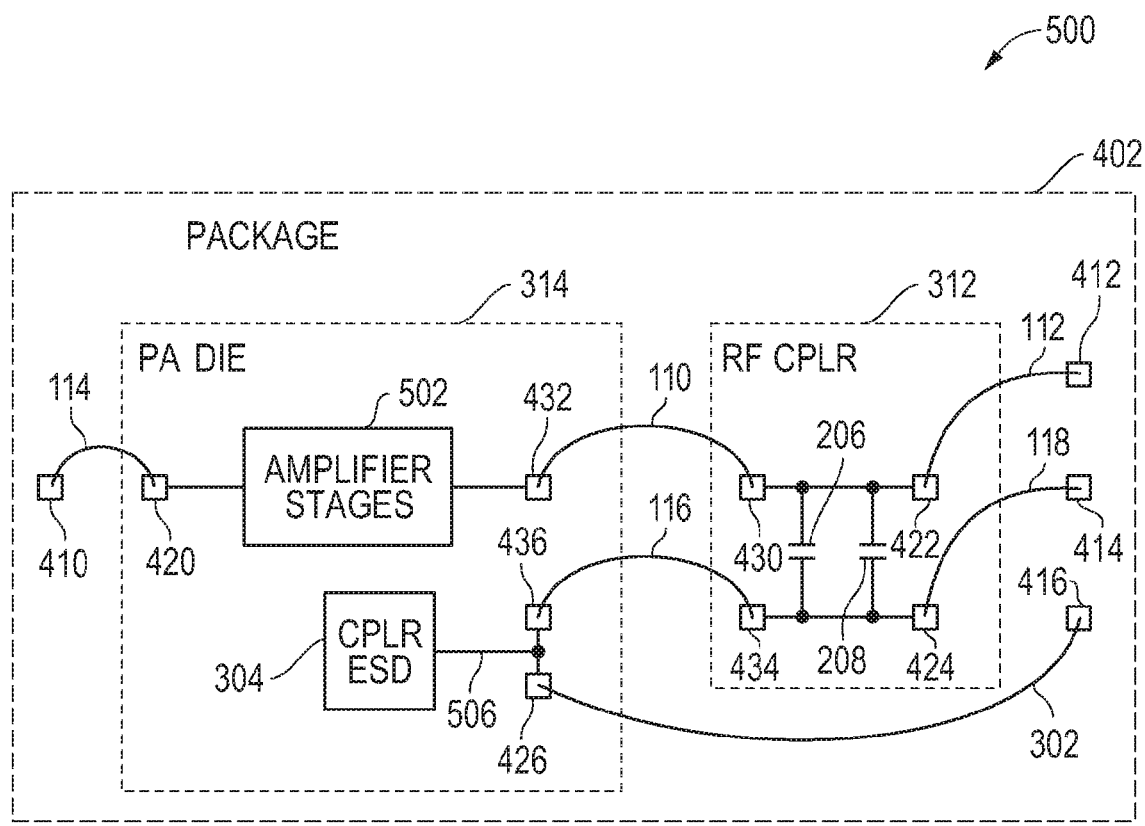
FIG. 5 is a connection diagram showing internal circuitry connections for a semiconductor package that includes an RF coupler and a PA die having coupler ESD circuitry.
Figure 6A:
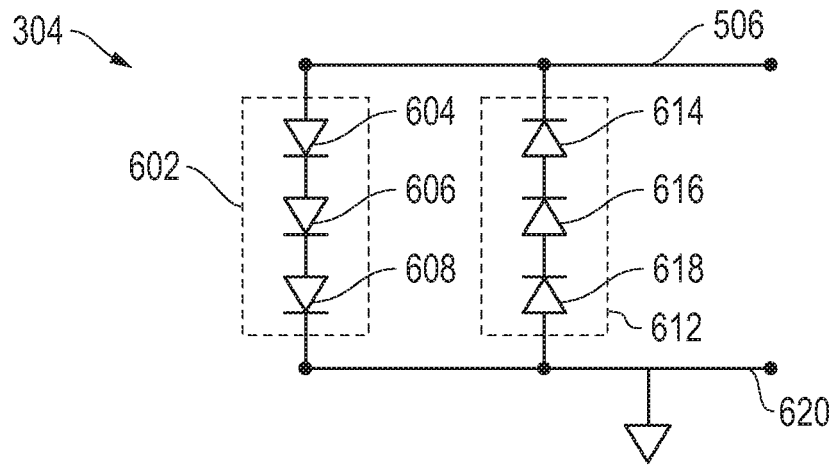
FIG. 6A is a circuit diagram for example ESD circuits that can be used for the coupler ESD circuitry.
Figure 6B:
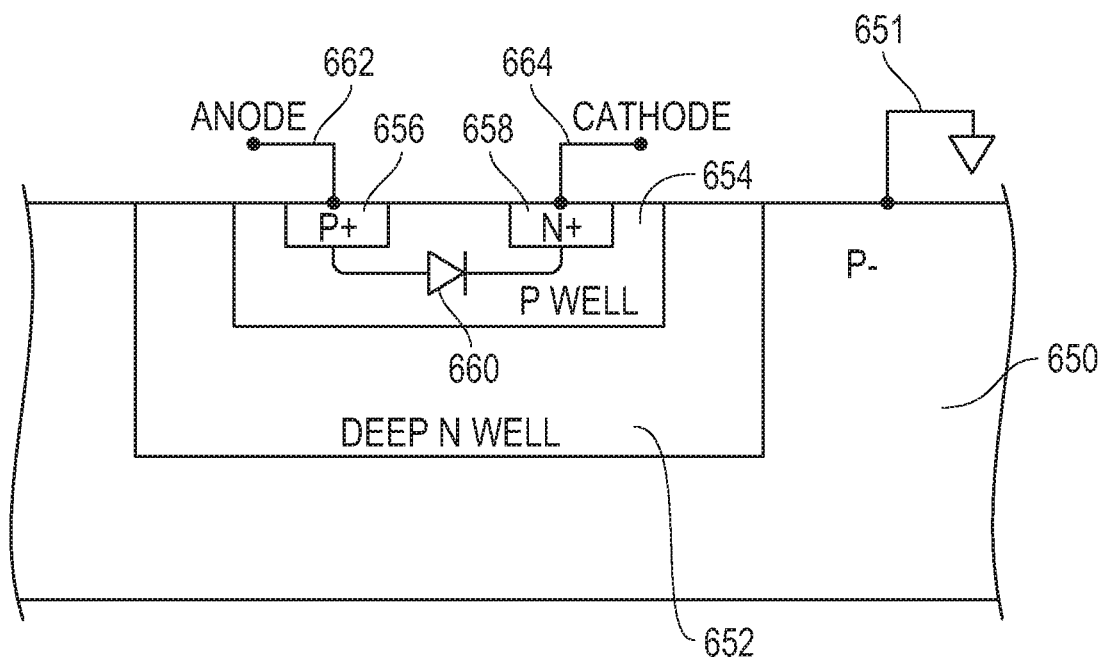
FIG. 6B is a process diagram showing a diode structure formed within a deep N well that can be used for the ESD diodes depicted in the ESD circuitry of FIG. 6A.

More particularly, FIG. 3 provides a diagram of an example embodiment for an RF coupler and a PA integrated circuit where coupler ESD circuitry is included on the PA integrated circuit. FIGS. 4A and 4B provide a top view and a side view connection diagram, respectively, for a semiconductor package that includes an RF coupler and a PA die having coupler ESD circuitry. FIG. 5 provides a connection diagram showing additional internal circuitry connections. FIGS. 6A and 6B provide example ESD circuits for the ESD circuitry. FIGS. 7A-C provide embodiments having coupler ESD circuitry blocks coupled to one or more RF power indicator signal lines from an RF coupler. And FIG. 8 provides an embodiment having coupler ESD circuitry integrated within an integrated circuit separate from a PA integrated circuit. Still further, it is noted that the embodiments described herein are particularly useful for PA circuitry and RF couplers used in cellular telephone handset applications where RF frequencies are typically above 600 MHz and generally between about 800 to 2000 MHz. It is further noted that the embodiments described herein could also be used with respect to other RF frequency ranges, if desired.

It is further noted that PA integrated circuits that may be utilized in the embodiments described herein include CMOS PA integrate circuits described in the following co-pending applications: U.S. patent application Ser. No. 12/151,199, entitled "Controlling Power with an Output Network" and filed May 5, 2008 (published as U.S. Published Patent Application 2009-0273397), and U.S. patent application Ser. No. 12/151,812, entitled "Supply Control For Multiple Power Modes Of A Power Amplifier" and filed May 8, 2008 (published as U.S. Published Patent Application 2009-0278609), each of which is hereby incorporated by reference in its entirety. Further, it is noted that stacked CMOS PA and RF coupler devices can also be utilized in the embodiments described herein, and example stacked CMOS PA and RF coupler devices are described in the following co-pending application: U.S. patent application Ser. No. 12/658,294, entitled "Stacked CMOS Power Amplifier and RF Coupler Devices and Related Methods" and filed Feb. 10, 2010, which is hereby incorporated by reference in its entirety.

FIG. 3 is a block diagram of an embodiment 300 that includes a power amplifier (PA) integrated circuit (IC) 314 providing coupler (CPLR) ESD protection circuitry 304 for an RF coupler 312. The RF coupler 312 can be a typical RF coupler, if desired. As described above, the RF coupler 312 receives a transmit input signal through signal line 110 and outputs a transmit signal through signal line 112 that is provided to antenna circuitry. As also described above, the RF coupler 312 can include a primary signal line that is electromagnetically coupled to a secondary signal line, as represented by inductors 202 and 204 and capacitors 206 and 208, to produce an output signal on signal line 116 that is representative of the transmit power to the antenna load. In particular, as described above, the signal on the coupled port 434 provides power proportional to the transmit forward power wave, and the signal on the isolated connection port 424 provides power proportional to the reverse transmit power wave. As also described above, the PA integrated circuit 314 can include PA ESD circuitry 250 coupled to the transmit signal line 110. And this PA ESD circuitry 250 can also be coupled internally to additional circuitry, as represented arrow 252.

In contrast with the prior solution above, however, the PA integrated circuit 314 also includes coupler (CPLR) ESD circuitry 304 that provides ESD protection associated with the connection points or ports for the RF coupler 312. For example, as described above, the typical RF coupler 312 includes capacitors 206 and 208 that will break down in the 200-400 volt range. To improve the ESD performance related to ESD events associated with the RF coupler 312, the PA integrated circuit 314 provides coupler ESD protection through the use of coupler ESD circuitry 304. As depicted, the signal line 116 from the RF coupler 312 is coupled to the coupler ESD circuitry 304, and an output signal line 302 is then provided by the PA integrated circuit 314 as the RF transmit (TX) power indicator signal that can be used by external circuitry. The output signal line 302 is also coupled to the coupler ESD circuitry 304. As such, ESD events associated with the secondary signal line and connection points 434 and 424 for the RF coupler 312 are handled by the coupler ESD circuitry 304 on the PA integrated circuit 314. Further, as described above, the signal lines connecting to the RF coupler 312 can be terminated with a resistor. For example, the signal line 118 and the output signal line 302 can be terminated with a resistor coupled to ground.

Advantageously, by providing additional coupler ESD protection though coupler ESD circuitry 304, the PA integrated circuit 314 allows for the ESD performance of the RF coupler 312 to be less robust. For example, the RF coupler 312 does not need to be redesigned or enhanced so that the breakdown voltages for capacitors 206 and 208 are significantly higher. This redesign or enhancement would require additional size and cost requirements on the RF coupler 312. Further, the additional size and cost, if any, to add the coupler ESD structures to the PA integrated circuit 314 is relatively small compared to the size and cost of providing that same ESD protection through the RF coupler 312 alone. Still further, the embodiments described herein allow capacitors with lower breakdown voltages, such as breakdown voltages below 100 volts, to be used for the RF coupler 312. For example, MIM (metal-insulator-metal) capacitors, which have relatively low breakdown voltages of less than 50 volts, can be used in the RF coupler 312 for capacitors 206 and 208.

Also as depicted in FIG. 3, connection points are shown with respect to the PA integrated circuit 314 and the RF coupler 312. The PA integrated circuit 314 receives the transmit input signal at connection point 420. The signal line 110 that includes the amplified transmit signal connects between connection point 432 on the PA integrated circuit 314 and connection point 430 on the RF coupler 312. The transmit signal line 112 connects to connection point 422 on the RF coupler 312. The signal line 118 connects to connection point 424 on the RF coupler 312. The signal line 116 connects to connection point 434 on the RF coupler 312 and to connection point 436 on the PA integrated circuit 314. The coupler ESD circuitry 304 is coupled to both connection point 436 and connection point 426 on the PA integrated circuit 314. The RF transmit (TX) power indicator signal line 302 is also connected to connection point 426 on the PA integrated circuit 314. It is also noted that connection points 426 and 436 could be implemented as a single connection node and/or a single connection point, if desired.

These connection points as shown in FIG. 3 are further used with respect to the layout and connection embodiments shown and described with respect to FIGS. 4A-B and 5. And it is noted that the connection points can be pins, bond pads, solder bumps and/or any other desired electrical connection points.

As described herein, it is desirable for the PA integrated circuit 314 and the RF coupler 312 to be included within the same semiconductor package to reduce size and cost requirements associated with the use of these two devices in communication systems. Because the RF coupler 312 is included in the package for the PA integrated circuit 314, it is desired that the connection points related to the RF coupler 312 have ESD protection as high as other pins on the chip package that relate to the PA circuitry. One common goal for communication devices is to have the ESD protection be able to withstand a 2 kV ESD event according to a human body model that is used for many integrated circuits.

With respect to ESD protection for the RF coupler 312, connection points 422 and 430 for the RF coupler 312 can be protected by using PA ESD circuitry within the PA integrated circuit 314 because connection points 422 and 430 have connections to the connection point 432 for the PA integrated circuit 314. The connection point 432 for the PA integrated circuit 314 is the RF transmit output pin for the PA integrated circuit 314 and will likely already have ESD protection, such as through PA ESD circuitry 250. Thus, in addition to providing ESD protection for the connection point or pin 432 on the PA integrated circuit 314, this PA ESD circuitry 250 also operates to protect from ESD events occurring with respect to connection points or pins 430 and 422 on the RF coupler 312.

Without connections to the coupler ESD circuitry 304, the connection points 434 and 424 providing the coupled port and isolated port for the RF coupler 312, however, would not have a direct connection to a connection point or pin on the PA integrated circuit 314. Further, the capacitors 206 and 208 within the RF coupler 312 are typically designed such that they have a break-down voltage in the 200-400 volt region. As such, ESD protection will be limited to an unacceptably low value for a single semiconductor package including both the PA integrated circuit 314 and the RF coupler 312.

The coupler ESD circuitry 304 included on the PA integrated circuit 314, however, provides an advantageous solution to this problem without requiring changes or enhancements to the RF coupler 312. By providing this coupler ESD circuitry 304 and connecting it to the RF coupler connection point 434 (coupled port) and/or the RF coupler connection point 424 (isolated port), ESD protection can be provided that exceeds typical requirements for integrated circuits in communication devices (e.g., 2 kV human ESD model) at a relatively low cost and without requiring larger sized devices. As described further below, ESD circuitry, such as diodes, can be fabricated as part of the PA circuitry and used for the coupler ESD circuitry 304 with little, if any, additional cost and/or size requirements with respect to the PA integrated circuit 314.

It is further noted that the CPLR ESD circuitry 304 could also be implemented as one or more circuit blocks and can be connected to different connection points, as desired. For example, CPLR ESD circuitry 304 could be connected to connection point 424 instead of connection point 434 as depicted in embodiment 300. In such an embodiment, signal line 116 could be provided as an output as the RF transmit (TX) power indicator without first passing through the PA IC 314, and the signal line 118 would be connected to and/or pass through the PA IC 314 and be coupled to the ESD circuitry 304 within the PA IC 314. Further, additional ESD circuitry blocks could be provided. For example, ESD circuitry block 304 could be coupled to connection point 434, and another ESD circuitry block could be provided and be coupled to connection point 424. As such, both signal lines 116 and 118 would be coupled to the ESD circuitry. It is further noted that if two ESD circuitry blocks were used, the ESD protection devices in each circuit block could be reduced in size, if desired, such as to one-half the size of a single block solution. Other variations could also be implemented, as desired, while still providing ESD circuitry that is coupled to the circuit path that includes connection points 434 and/or 424 for the RF coupler 312. As stated above, by including this coupler ESD circuitry, ESD protection is provided for the RF coupler without requiring larger capacitors or other ESD circuits within the RF coupler circuitry, thereby reducing size and cost requirements. It is further noted that FIGS. 7A-7C, discussed in more detail below, provide examples for different embodiments having ESD circuitry blocks connected to signal line 116 or signal line 118 or both for the RF coupler.

FIG. 4A is a connection diagram of an embodiment 400 for a PA integrated circuit and an RF coupler (CPLR) 312 included together within a semiconductor package 402. For the embodiment 400, it is assumed that the PA integrated circuit is in the form of a PA integrated circuit die 314. As depicted, the PA die 314 includes four bond pads or connection points 420, 426, 432 and 436, but would likely include more that are not depicted. As depicted, the RF coupler 312 also includes four bond pads or connection points 422, 424, 430 and 434. These connection points are also shown in FIG. 3, as described above. As further shown in FIG. 4A, the semiconductor package 402 includes four bond pads or connection points 410, 412, 414 and 416, which represent output pins or connection points for the semiconductor package 402 when packaging is completed. It is noted that these connection points are being provided as an example and that other and/or additional connection points could also be utilized, as desired. For example, the semiconductor package 402 could include additional connection points coupled to the PA integrated circuit die 314 for additional functionality, control, communications or other desired purposes. For example, a transmit power control connection point could be provided for the semiconductor package 402 so that a transmit power control signal can be applied from external circuitry to power amplifier circuitry within the PA integrated circuit die 314.

With respect to the transmit path, the transmit input (TX IN) signal line 411 is connected to the semiconductor package 402 at connection point 410. The connection point 410 for the semiconductor package 402 is then connected to connection point 420 for the PA die 314 to provide the transmit input signal through signal line 114 to the internal circuitry (not shown) of the PA die 314. The PA die 314 then provides an amplified transmit signal to signal line 110 through connection point 432. Signal line 110 is connected between connection point 432 on the PA die 314 and connection point 430 on the RF coupler 312 to provide the amplified transmit signal to the internal circuitry (not shown) of the RF coupler 312. The RF coupler 312 then outputs the transmit signal on signal line 112 from connection point 422 to the connection point 412 for the semiconductor package 402. The output signal line 413 from the semiconductor package 402 is the transmit output (TX OUT) signal that can then be provided to antenna circuitry for output by the system.

With respect to the transmit power detection path, the RF coupler 312 provides an output signal indicative of the transmit power to signal line 116 through connection point 434. Connection point 434 on the RF coupler 312 is also connected to connection point 436 on the PA die 314. The connection point 436 on the PA die 314 is connected to connection point 426 on the PA die 314 and passes the transmit power indication signal to output signal line 302. It is again noted that connection points 426 and 436 could be a single connection node or connection point, if desired. In addition to being connected to connection point 426 on PA die 314, output signal line 302 is also connected to connection point 416 on the semiconductor package 402. The output signal line 417 from the semiconductor package is the RF transmit (TX) power indicator signal that can be used by external circuitry as an indication of the transmit power to the load. It is noted that the RF transmit (TX) power indicator output signal line 417 can be terminated externally with a resistor to ground or through another termination connection, as desired. Further, connection point 414 for the semiconductor package 402 can provide the isolated port signal to signal line 415, and the connection point 414 can also be connected to connection point 424 on the RF coupler 312 through signal line 118. It is noted that signal line 415 can be terminated externally with a resistor to ground or through another termination connection, as desired. Alternatively, the signal line 415 can be used as a coupled input (CPLD-IN) signal line, as indicated in FIG. 4A, to daisy chain multiple direct RF couplers through a 50 ohm transmit (TX) line. For example, multiple PAs configured to operate in different frequency bands can have their respective direct RF couplers daisy chained together to allow a signal power detector receiver in the transceiver or baseband processing circuitry to service multiple PAs.

With respect to ESD protection, coupler (CPLR) ESD circuitry 304 is coupled to connection points 436 and 426 on the PA die 314 so that ESD protection is provided for the transmit power indicator signal circuit path that travels from the RF coupler 312 to the connection point 416 for the semiconductor package 402 through connection points 436 and 426 on the PA die 314. Advantageously, therefore, if an ESD event occurs on output signal line 417 and connection point 416, the coupler ESD circuitry 304 will operate to provide protection from such an event. Similarly, if an ESD event occurs on signal line 415 and connection point 414, the coupler ESD circuitry 304 will also operate to provide protection. The coupler ESD circuitry 304 provides this protection by being connected to the circuit path that includes the signal line 415, connection point 414 on the semiconductor package 402, connection point 424 on the RF coupler 312, connection point 434 on the RF coupler 312, connection point 436 on the PA die 314, connection point 426 on the PA die 314, connection point 416 on the semiconductor package 402 and the RF transmit power indicator line 417. Thus, an ESD event that occurs on this circuit path will be shorted to ground through the coupler ESD circuitry 304.

It is further noted that an ESD event occurring on output signal line 413 and connection point 412, as described above, will be addressed by PA ESD circuitry coupled to connection point 432 on the PA die 314. This is shown, for example, with respect to PA ESD circuitry 250 in FIG. 3. Similarly, an ESD event occurring on signal line 114 and connection point 420 will also be addressed by PA ESD circuitry coupled to connection point 420. As described above, the PA die 314 will typically be configured to have ESD protection coupled to each of its input/output connections or pins.

It is also noted that the signal lines or connections between the connection points for the semiconductor package 402, the PA die 314 and the RF coupler 312 can be made using bond wires, if desired. Other connection techniques available for connecting circuitry within a semiconductor package could also be utilized, if desired. For example, the PA die 314 and/or the RF coupler 312 could be implemented as bumped die or devices such that connective bumps are used to connect the RF coupler 312 to the PA die 314 and/or to connect the PA die 314 to the semiconductor package 402. Similarly, the semiconductor package 402 could also be implemented as a bumped semiconductor device that uses connective bumps rather than bond pads at the edge of the semiconductor package 402 to provide connectivity to external circuitry. If desired, the direct RF coupler circuitry could also be formed on the same die as the PA circuitry such that the RF coupler is integrated on the PA die. If a single die embodiment were implemented, the connections between the PA die 314 and the RF coupler 312 shown in the example embodiments depicted in FIGS. 4A, 4B and 5 would be implemented as electrical connections on the same die, such as through metal and/or other connection lines, as opposed to being implemented as external connections. Thus, embodiment 400 could be implemented with a variety of connection techniques, as desired, while still taking advantage of the coupler ESD circuitry 304 included on the PA die 314.

It is further noted that the packaging of the PA die 314 and RF coupler 312 into a single semiconductor package can be implemented in a variety of ways using standard semiconductor packaging techniques. For example, the two devices can be stacked and encapsulated in a plastic, insulated package with external bond wires, external connection pins and/or external bonding pads as is done for many integrated circuits. In addition, as described above, the RF coupler could also be integrated on the PA die itself, and then the PA die could be packaged. Further, it is also understood that other packaging techniques could be utilized while still providing a single semiconductor package 402 for the PA die 314 and RF coupler 312, as described herein.

FIG. 4B is an example side view for the connection diagram of FIG. 4A. As depicted, the RF coupler 312 is stacked or positioned on top of the PA die 314, which is in turn stacked or positioned on top of the semiconductor package 402. As described above, input transmit signal line 114 is connected between connection point 410 on the semiconductor package 402 and connection point 420 on the PA die 314. The amplified output transmit signal line 112 is connected between connection point 422 on the RF coupler 312 and connection point 412 on the semiconductor package 402. The signal line 116 is connected between connection point 434 on the RF coupler 312 and connection point 436 on the PA die 314. As also described above, connection point 436 is connected to connection point 426 on the PA die 314, and the output signal line 302 is connected between connection 426 and connection point 416 on the semiconductor package 402. It is again noted that connection points 426 and 426 could be implemented as a single node or connection point, if desired. Further, as would be understood with respect to standard semiconductor packaging, the semiconductor package 402 provides mechanical support for the PA die 314 and provides external connections that are used by the PA die 314 and the RF coupler 312 to communicate signals to and from external circuitry.

FIG. 5 is a block diagram that provides an embodiment 500 that is similar to embodiment 400 of FIG. 4A with internal circuit blocks depicted with respect to the PA die 314 and the RF coupler 312. In particular, amplifier stages 502 are now depicted as being within the PA die 314 and connected between connection points 420 and 432. The amplifier stages 502 operate to amplify the incoming RF transmit signal and to output the amplified RF transmit signal. The coupler (CPLR) ESD circuitry 304 is also shown within the PA die 314. Further, within the RF coupler 312, the internal signal paths between connection points 422 and 430 and between connection points 424 and 434 are depicted. In addition, the capacitors 206 and 208 are also shown within the RF coupler 312, as described above. With respect to the coupler ESD circuitry 304, the connection points 426 and 436 are coupled together, and the coupler ESD circuitry 304 is connected through signal line 506 to the signal line between connection point 426 and connection point 436 so the coupler ESD circuitry 340 is connected to both connection points 426 and 436. Again it is noted that connection points 426 and 426 could be implemented as a single node or connection point, if desired.

As described above, ESD protection with respect to the semiconductor package 402 are advantageously improved using the coupler ESD circuitry 304 on the PA die 314 to facilitate ESD protection rather than relying upon the RF coupler 312 itself. Advantageously, an ESD event that occurs on connection point 414 and/or connection point 416 will be handled by the coupler ESD circuitry 304. Thus, as described above, by providing coupler ESD circuitry 304 within the PA die 314, there is no need to significantly increase the ESD protection capability of the RF coupler 312, for example, which might require additional expense and/or size requirements.

It is noted that ESD protection for standard CMOS input/output pins or connections points is often implemented using a diode to ground. One or more diodes can also be utilized to implement the PA ESD circuitry 250 and/or the coupler ESD circuitry 304 described herein. However, the coupler ESD circuitry 304 for the RF coupler 312 is preferably implemented as described in more detail with respect to FIGS. 6A and 6B below. One reason is that the capacitance of the coupler ESD circuitry 304 is preferably made as low as possible because capacitance to ground on connection point 434 for the RF coupler 312 can introduce an undesirable mismatch and reflection. While some capacitance can be accounted for in the design of the RF coupler itself, a large capacitance can negatively impact the directivity of the RF coupler. Another reason is that the RF coupler signal on connection point 434 will often swing above and below ground and therefore have negative voltages. As such, a standard ESD circuit using a diode to ground will clip this signal thereby resulting in errors in the transmit power detect function provided by the RF coupler 312. For example, this clipping will occur when the signal voltage drops below ground by more than the base-to-emitter junction turn-on voltage for the diode clamp, thereby causing the diode to turn on and to clamp the signal thereby causing an undesirable signal loss.

FIGS. 6A and 6B provide example circuitry that can provide ESD protection for the RF coupler while reducing the undesirable effects of standard ESD protection diodes. In particular, as described further below, relatively simple diode structures can be used to reduce capacitance. Also, two sets of serially connected diodes (e.g., three diodes) can be used to allow the signal to swing around ground without clipping. And the diodes can be formed in deep N wells in order to isolate the diodes from other circuitry and reduce undesirable parasitic capacitance.

FIG. 6A is a circuit diagram for example circuitry that can be used for the coupler ESD circuitry 304. As depicted, the coupler ESD circuitry 304 includes ESD circuit 602 and ESD circuit 612. The signal line 506, which connects to connection points 436 and 426, as described above, is coupled to ESD circuit 602 and ESD circuit 612. ESD circuit 602 includes three serially connected diodes 604, 606 and 608 that together provide ESD protection for ESD events that cause positive voltages to occur on signal line 506 with respect to the ground signal line 620. Such a positive ESD event of significant size will cause the serially connected diodes 604, 606 and 608 to turn "on" and discharge the ESD event to ground. ESD circuit 612 includes three serially connected diodes 614, 616 and 618 that together provide ESD protection for ESD events that cause negative voltages to occur on signal line 506 with respect to the ground signal line 620. Such a negative ESD event of significant size will cause the serially connected diodes 604, 606 and 608 to turn "on" and discharge the ESD event to ground. Thus, the diodes within ESD circuit 602 are configured to provide a forward current flow from signal line 506 to the ground signal line 620, and the diodes within ESD circuit 612 are configured to provide a forward current flow form the ground signal line 620 to the signal line 506. As indicated below, one or more diodes could be used, and different configurations and ESD circuitry could also be used, as desired, while still taking advantage of coupler ESD circuitry 304 integrated on the PA die 314.

It is noted that the diodes 604, 606, 608, 614, 616 and 618 can be configured to be the same, if desired. Further, each diode 604, 606, 608, 614, 616 and 618 can be configured to provide voltage flow if a positive voltage of about 0.6 volts is applied across the diode. As such, if a positive voltage of about 1.8 volts or greater is applied with respect to signal line 506 as compared to ground signal line 620, current will flow through the three serially connected diodes 604, 606 and 608 within ESD circuit 602. Similarly, if a negative voltage of about 1.8 volts or greater is applied with respect to signal line 506 as compared to ground signal line 620, current will flow through the three serially connected diodes 614, 616 and 618 within ESD circuit 612. By using the two sets of three diodes shown in ESD circuit 602 and 612, the coupled signal on signal line 506 can swing plus-or-minus one volt without producing a diode current, while still considering variations in the diodes due to process and temperature variations. For example, a typical 20 dB RF coupler detecting a 28 dB WCDMA-based transmit output signal will typically generate a signal swing of ±0.8 volts. The ESD circuitry depicted in FIG. 6A can allow for these signal swings in normal operation without having current flowing through the diodes. It is further noted that the forward bias voltage for the ESD diodes could be different from the 0.6 volts indicated above, depending upon the diode structures used.

It is noted that the number of diodes used within ESD circuit 602 and/or ESD circuit 612 could be adjusted as desired, depending upon the requirements of the communication device within which the PA die 314 and the RF coupler 312 are being used. For example, a single diode could be used, if desired. In the example depicted, three diodes are selected assuming that the communication device is intended to operate in a WCDMA communications environment with an RF coupler designed for use with WCDMA signals. It is further noted that for a GSM communications environment, it might be more desirable to use four serially connected diodes with respect to an RF coupler designed for use with GSM signals. It is further noted that different implementations for ESD circuitry 304 could also be utilized, as desired, depending upon the requirements of the communication device within which the PA die 314 and the RF coupler 312 are being used. Thus, different numbers of diodes and/or different ESD circuitry could be used, as desired, based upon the communications environment and signals within which the devices are operating, while still taking advantage of the coupler ESD circuitry included on the PA die 314.

FIG. 6B is a process diagram showing an example diode structure formed within a semiconductor substrate 650 for the PA die 314. This diode structure can be used, if desired, for one or more of the diodes 604, 606, 608, 614, 616 and 618 depicted in FIG. 6A, or this diode structure could be used for all of the ESD diodes, if desired. In the embodiment depicted, the semiconductor substrate 650 for the PA die 314 is a lightly doped P-type substrate (P−) that is used as the substrate within which is formed the CMOS circuitry for the PA die 314, for example, using known semiconductor CMOS processing techniques. As indicated above, it is further noted that circuitry for the RF coupler 312 could also be formed on the semiconductor substrate 650, if desired, so that PA circuitry and RF coupler circuitry are integrated on the same die. As depicted, a portion of the semiconductor substrate 650 is doped with an N-type dopant to form a deep N well structure 652 within the P-type semiconductor substrate 650. And a portion of the deep N well 652 can in turn be doped with a P-type material to form a P well 654 within the deep N well 652. The deep N well 652 and the P well 654 can also be formed, for example, using known semiconductor CMOS processing techniques.

The ESD diode structure can then be formed within the P well 654. A heavily doped P-type region (P+) 656 can be formed to provide the anode 662 for the diode, and a heavily doped N-type region (N+) 658 can be formed to provide the cathode 664 for the diode. The diode symbol 660 represents the diode circuit that is created. It is noted that the semiconductor substrate 650 will typically be tied to ground as indicated by connection 651.

By forming the ESD diode circuit within the deep N well, the diode circuit is isolated from the other PA circuitry. Advantageously, this isolation reduces parasitic capacitances associated with the diode circuits being used for coupler ESD protection thereby improving performance. Further, the deep N well can be left to be a floating node within the PA die 314 in order to further reduce parasitic capacitance and improve isolation. Alternatively, the deep N well could be coupled to a voltage node within the PA die 314, such as a high voltage node, a supply voltage (VDD) or a battery voltage (VBAT), if desired.

FIGS. 7A-C are block diagrams of embodiments having one or more coupler ESD circuitry blocks within an integrated circuit coupled to one or more signal lines from an RF coupler. For these embodiments, an integrated circuit (IC) 702 includes the CPLR ESD circuitry 304. This integrated circuit (IC) 702 could also include power amplifier circuitry, as described above, and operate as the PA IC 314 described above. However, the integrated circuit (IC) 702 does not have to include the power amplifier circuitry and could be used for a separate and/or additional purpose. For example, as described in further detail with respect to FIG. 8 below, the integrated circuit (IC) 702 could be a control IC used to help control operations of a separate PA IC, if desired.

FIG. 7A provides an example embodiment 700 including an integrated circuit (IC) 702 and an RF coupler 312 within single semiconductor package 402. For this embodiment 700, signal line 116 from the RF coupler 312, which provides the RF forward power indicator signal, is connected to the CPLR ESD circuitry 304. And the CPLR ESD circuitry 304 is also connected to the RF transmit (TX) power indicator signal line 302. Further, as described above, the RF coupler 312 receives an RF input signal on signal line 110, which passes through the RF coupler 312, and provides an RF output signal on signal line 112. As also described above, the signal line 118 provides an RF reverse power indicator signal or can be used to daisy chain multiple RF couplers as described with respect to FIG. 4A above.

FIG. 7B provides an example embodiment 750 including an integrated circuit (IC) 702 and an RF coupler 312 within single semiconductor package 402. For this embodiment 750, signal line 118 from the RF coupler 312 is connected to the CPLR ESD circuitry 304. And the CPLR ESD circuitry 304 is also connected to the output signal line 752 representing the signal on signal line 118. Further, signal line 116 could be output by the single semiconductor package 402 as the RF transmit (TX) power indicator signal line.

FIG. 7C provides an example embodiment 780 including an integrated circuit (IC) 702 and an RF coupler 312 within a single semiconductor package 402. For this embodiment 780, signal line 116 from the RF coupler 312 is connected to the CPLR ESD circuitry 304A, and signal line 118 from the RF coupler 312 is connected to the CPLR ESD circuitry 304B. The CPLR ESD circuitry 304A is also connected to the RF transmit (TX) power indicator signal line 302, and the CPLR ESD circuitry 304B is also connected to the output signal line 752 representing the signal on signal line 118. It is noted that the ESD circuits used for the two CPLR ESD circuitry 304A and 304B could be reduced in size, if desired, because multiple ESD circuitry blocks are being used. Further, CPLR ESD circuitry 304A and 304B could use the same ESD circuits or different ESD circuits, as desired.

FIG. 8 is a block diagram of an embodiment 800 having coupler ESD circuitry 304 integrated within a control integrated circuit (IC) 802 that is separate from a PA integrated circuit (IC) 804. In the embodiment 800 depicted, the CPLR ESD circuitry 304 is connected to the signal line 116 from the RF coupler 312, and the CPLR ESD circuitry 304 is also connected to the RF transmit (TX) power indicator signal line 302. The control IC 802 also includes control signal lines 806 that are coupled to the PA IC 804 and includes control signal lines 808 that can be coupled to an external device, such as a transceiver or baseband processor integrated circuit.

It is further noted that the semiconductor processing used to fabricate the different ICs for the embodiments described herein could be selected, as desired. For example, with respect to FIGS. 3, 4A-B and 5, the PA IC 314 could integrated on a silicon substrate using CMOS processing. Similarly, the integrated circuit 702 in FIGS. 7A-C could also be integrated on a silicon substrate using CMOS processing. Further, with respect to FIG. 8, the PA IC 804 could be integrated on a GaAs (gallium arsenide) substrate, and the control IC 802 could be a CMOS integrated circuit integrated on a silicon substrate using CMOS processing. Other semiconductor processing could also be used, as desired, while still providing CPLR ESD circuitry on an integrated circuit within the same semiconductor package as the RF coupler so as to provide ESD protection for the RF coupler without requiring expensive additional size and cost requirements for the RF coupler.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. A semiconductor package having electrostatic discharge (ESD) protection, comprising:
a radio frequency (RF) coupler having an RF input port, an RF output port, and an RF forward power indicator port, and a capacitor having a breakdown voltage of less than approximately 100V, the RF forward power indicator port being configured to provide an RF forward power indicator signal proportional to an RF signal passing through the RF coupler;
an RF forward power indicator connection point for the semiconductor package coupled to the RF forward power indicator port for the RF coupler; and
an integrated circuit having coupler ESD circuitry integrated within the integrated circuit, the coupler ESD circuitry being coupled to a circuit path including the RF forward power indicator port for the RF coupler and the RF forward power indicator connection point for the semiconductor package, the coupler ESD circuitry being configured to provide ESD protection for ESD events associated with the RF forward power indicator port for the RF coupler and the RF forward power indicator connection point for the semiconductor package.

2. The semiconductor package of claim 1, further comprising an RF transmit input connection point for the semiconductor package, an RF transmit output connection point for the semiconductor package, and power amplifier circuitry coupled to the RF transmit input connection point, wherein the power amplifier circuitry is configured to receive an RF transmit signal through the RF transmit input connection point and to output an amplified RF transmit signal to the RF input port for the RF coupler, and wherein the RF output port for the RF coupler is configured to provide an RF output signal to the RF transmit output connection point for the semiconductor package.

3. The semiconductor package of claim 2, wherein the power amplifier (PA) circuitry is integrated on the integrated circuit with the coupler ESD circuitry.

4. The semiconductor package of claim 3, wherein the RF coupler is positioned on top of the integrated circuit.

5. The semiconductor package of claim 3, wherein the RF coupler is integrated on the integrated circuit.

6. The semiconductor package of claim 3, wherein the integrated circuit is a CMOS integrated circuit.

7. The semiconductor package of claim 2, wherein the power amplifier (PA) circuitry is integrated on a separate integrated circuit from the integrated circuit with the coupler ESD circuitry.

8. The semiconductor package of claim 2, wherein the coupler ESD circuitry is coupled to a connection point for the integrated circuit and wherein the connection point is connected to the RF forward power indicator port for the RF coupler.

9. The semiconductor package of claim 8, wherein the connection point is also connected to the RF forward power indicator connection point for the semiconductor package.

10. The semiconductor package of claim 8, further comprising a second connection point on the integrated circuit, wherein the second connection point is coupled to the connection point, and wherein the second connection point is connected to the RF forward power indicator connection point for the semiconductor package.

11. The semiconductor package of claim 2, wherein the coupler ESD circuitry is coupled to a connection point for the integrated circuit and wherein the connection point is connected to the RF forward power indicator port for the RF coupler through an RF reverse power indicator port for the RF coupler.

12. The semiconductor package of claim 2, wherein the coupler ESD circuitry comprises multiple ESD circuitry blocks.

13. The semiconductor package of claim 2, wherein the power amplifier (PA) circuitry is integrated on the integrated circuit with the coupler ESD circuitry, wherein the integrated circuit further comprises power amplifier (PA) ESD circuitry integrated within the integrated circuit, wherein the PA ESD circuitry is configured to provide ESD protection for ESD events associated with the PA circuitry, and wherein the PA ESD circuitry is separate from the coupler ESD circuitry.

14. The semiconductor package of claim 2, wherein the coupler ESD circuitry comprises a plurality of serially connected diodes.

15. The semiconductor package of claim 14, wherein at least one of the diodes is formed within a deep N well within a semiconductor substrate for the integrated circuit.

16. The semiconductor package of claim 15, wherein the deep N well is configured to be a floating node within the integrated circuit.

17. The semiconductor package of claim 14, wherein the coupler ESD circuitry comprises a first ESD circuit having a plurality of serially connected diodes configured to provide current flow in a first direction, and wherein the coupler ESD circuitry further comprises a second ESD circuit having a plurality of serially connected diodes configured to provide current flow in a second direction.

18. The semiconductor package of claim 17, wherein the first and second ESD circuits each include three serially connected diodes.

19. The semiconductor package of claim 17, wherein at least one of the diodes is formed within a deep N well within a semiconductor substrate for the integrated circuit.

20. The semiconductor package of claim 19, wherein the deep N well is configured to be a floating node within the integrated circuit.

21. A power amplifier (PA) integrated circuit having electrostatic discharge (ESD) protection, comprising:
    a first input connection point configured to receive a RF transmit input signal;
    a first output connection point configured to output an amplified RF transmit output signal;
    power amplifier (PA) circuitry configured to receive the RF transmit input signal and to provide the amplified RF transmit output signal;
    a second input connection point configured to be coupled to a circuit path including an RF forward transmit power indicator port for an RF coupler that provides an RF forward power indicator signal proportional to an RF signal passing through the RF coupler, the RF coupler comprising and a capacitor having a breakdown voltage of less than approximately 100V; and
    coupler ESD circuitry coupled to the second input connection point, the coupler ESD circuitry configured to provide ESD protection for ESD events associated with the RF forward transmit power indicator port for the RF coupler.

22. The PA integrated circuit of claim 21, wherein the PA integrated circuit is a CMOS integrated circuit.

23. The PA integrated circuit of claim 21, further comprising RF coupler circuitry integrated within the PA integrated circuit.

24. The PA integrated circuit of claim 21, further comprising a second output connection point coupled to the second input connection point and configured to output an RF forward transmit power indicator signal.

25. The PA integrated circuit of claim 21, further comprising PA ESD circuitry coupled to the first output connection point for the PA die, the PA ESD circuitry being separate from the coupler ESD circuitry and being configured to provide ESD protection for ESD event associated with the first output connection point.

26. The PA integrated circuit of claim 21, wherein the coupler ESD circuitry comprises a plurality of serially connected diodes.

27. The PA integrated circuit of claim 26, wherein the coupler ESD circuitry comprises a first ESD circuit having a plurality of serially connected diodes configured to provide forward current flow in a first direction, and wherein the coupler ESD circuitry further comprises a second ESD circuit having a plurality of serially connected diodes configured to provide forward current flow in a second direction.

28. The PA integrated circuit of claim 26, wherein at least one of the diodes is formed within a deep N well within a semiconductor substrate for the PA integrated circuit.

29. The PA integrated circuit of claim 28, wherein the deep N well is configured to be a floating node within the PA integrated circuit.

30. A method for providing electrostatic discharge (ESD) protection for a radio frequency (RF) coupler combined in a semiconductor package with an integrated circuit, comprising:
    passing a radio frequency (RF) signal through an RF coupler included within a semiconductor package to produce an RF output signal and an RF forward power indicator signal proportional to the RF signal passing through the RF coupler, the RF coupler comprising a capacitor having a breakdown voltage of less than approximately 100V;
    outputting the RF forward power indicator signal from an RF forward power indicator connection point on the semiconductor package, the RF forward power indicator connection point being coupled to a RF forward power indicator port for the RF coupler to receive the RF forward power indicator signal; and
    using an integrated circuit within the semiconductor package to provide ESD protection for ESD events associated with the RF forward power indicator port for the RF coupler and the RF forward power indicator connection point on the semiconductor package, the integrated circuit including coupler ESD circuitry integrated within the integrated circuit, and the coupler ESD circuitry being coupled to a circuit path including the RF forward power indicator port for the RF coupler and to the RF forward power indicator connection point for the semiconductor package.

31. The method of claim 30, further comprising amplifying an RF transmit input signal with power amplifier (PA) circuitry included within the semiconductor package to produce an amplified RF transmit signal, and providing the amplified RF transmit signal as the RF signal passed through the RF coupler.

32. The method of claim 31, wherein the PA circuitry is integrated on the integrated circuit with the coupler ESD circuitry.

33. The method of claim 31, wherein the PA circuitry is integrated on a separate integrated circuit from the integrated circuit with the coupler ESD circuitry.

34. The method of claim 31, wherein the using step comprises using coupler ESD circuitry that includes a plurality of serially connected diodes.

35. The method of claim 34, wherein at least one of the diodes is formed within a deep N well within a semiconductor substrate for the integrated circuit.

36. The method of claim 35, further comprising allowing the deep N well to be a floating node within the integrated circuit.

37. The method of claim 34, wherein the using step further comprises using a first ESD circuit having a plurality of serially connected diodes configured to provide forward current flow in a first direction, and using a second ESD circuit having a plurality of serially connected diodes configured to provide forward current flow in a second direction.

38. The method of claim 31, further comprising applying a transmit power control signal to the PA circuitry within the semiconductor package, the transmit power control signal being based upon the RF forward power indicator signal.

* * * * *